(12) United States Patent
Tsuji et al.

(10) Patent No.: US 7,718,544 B2
(45) Date of Patent: May 18, 2010

(54) METHOD OF FORMING SILICON-CONTAINING INSULATION FILM HAVING LOW DIELECTRIC CONSTANT AND LOW DIFFUSION COEFFICIENT

(75) Inventors: Naoto Tsuji, Tama (JP); Kiyohiro Matsushita, Tama (JP); Satoshi Takahashi, Tama (JP); Nathan Kameling, Tama (JP)

(73) Assignee: ASM Japan K.K., Tokyo (JP)

( * ) Notice: Subject to any disclaimer, the term of this patent is extended or adjusted under 35 U.S.C. 154(b) by 344 days.

(21) Appl. No.: 11/382,512

(22) Filed: May 10, 2006

(65) Prior Publication Data

US 2006/0183341 A1    Aug. 17, 2006

Related U.S. Application Data

(60) Provisional application No. 60/695,797, filed on Jun. 30, 2005.

(51) Int. Cl.
*H01L 21/31* (2006.01)
(52) U.S. Cl. .............. 438/758; 438/778; 438/780; 257/E21.27
(58) Field of Classification Search .......... 438/201, 438/211, 216, 219, 221, 257, 295, 296, 355, 438/359, 404, 421, 424, 637, 758, 765, 770, 438/778–780, 787, 789, 792–794; 257/E21.27
See application file for complete search history.

(56) References Cited

U.S. PATENT DOCUMENTS

2003/0176030 A1*    9/2003    Tsuji et al. ............ 438/200

OTHER PUBLICATIONS

Baklanov et al., "Characterisation of Low-K Dielectric Films by Ellipsometric Porosimetry", 2000, Mat. Res. Soc. Symp. Proc. vol. 612, pp. D4.2.1-D4.2.12.*
D. Shamiryan, et al., Pinhole density measurements of barriers deposited on low-k films, Microelectronic Engineering 70/2-4 (2003) 341-345.
Konstaintin P. Mogilnikov, et al., A Discussion of the Practical Importance of Positron Annihilation Lifetime Spectroscopy Percolation Threshold in Evaluation of Porous Low-K Dielectrics, Japanese Journal of Applied Physics, vol. 43, No. 1, 2004, pp. 247-248.

* cited by examiner

*Primary Examiner*—Alexander G Ghyka
*Assistant Examiner*—Leonard Chang
(74) *Attorney, Agent, or Firm*—Knobbe, Martens, Olson & Bear LLP

(57) ABSTRACT

A method for fabricating a semiconductor device includes: forming on a substrate a silicon-containing insulation film having a diffusion coefficient of about 250 $\mu m^2$/min or less as measured using isopropyl alcohol, by plasma reaction using a reaction gas comprising (i) a source gas comprising a silicon-containing hydrocarbon compound containing plural cross-linkable groups, (ii) a cross-linking gas, (iii) an inert gas, and optionally (iv) an oxygen-supplying gas, wherein a flow rate of the oxygen-supplying gas is no more than 25% of that of the source gas; and subjecting the insulation film to an integration process to fabricate a semiconductor device.

20 Claims, 5 Drawing Sheets

METHOD OF FORMING SILICON-CONTAINING INSULATION FILM HAVING LOW DIELECTRIC CONSTANT AND LOW DIFFUSION COEFFICIENT

CROSS-REFERENCE TO RELATED APPLICATIONS

This application claims the benefit of U.S. Provisional Application No. 60/695,797, filed Jun. 30, 2005, the disclosure of which is herein incorporated by reference in its entirety.

BACKGROUND OF THE INVENTION

1. Field of the Invention

The present invention generally relates to a semiconductor technique and more particularly to a method for forming on a semiconductor substrate a silicon-containing insulation film having high resistance to diffusion by using a plasma CVD (chemical vapor deposition) apparatus. The present invention also relates to a method of fabricating a semiconductor device.

2. Description of the Related Art

As semiconductors have progressed to accommodate a demand for high speed and high density in recent years, a reduction of capacitance between lines is required to avoid signal delays in the multi-layer wiring technology field. Because a reduction in the dielectric constant of a multi-layer wiring insulation film is required in order to reduce the capacitance between lines, insulation films having low dielectric constants have been developed.

Conventionally, a silicon oxide ($SiO_x$) film is formed by adding oxygen ($O_2$), nitric oxide (NO) or nitrous oxide ($N_2O$) as an oxidizing agent to a silicon source gas such as $SiH_4$ and $Si(OC_2H_5)_4$, and applying heat or plasma energy to the source gas. A dielectric constant ($\in$) of this film was approximately 4.0.

By contrast, by using a spin-coat method using inorganic silicon oxide glass (SOG) materials, a low dielectric constant insulation film having a dielectric constant ($\in$) of approximately 2.3 was formed.

By using a plasma CVD method with CxFyHz as a source gas, a low dielectric constant fluorinated amorphous carbon film having a dielectric constant ($\in$) of approximately 2.0 to 2.4 was formed. Further, by using a plasma CVD method using a silicon-containing hydrocarbon (for example, P-TMOS (phenyltrimethoxysilane) as a source gas, a low dielectric constant insulation film having a dielectric constant ($\in$) of approximately 3.1 was formed. Additionally, by using a plasma CVD method using a silicon-containing hydrocarbon having plural alkoxy groups as a source gas, a low dielectric constant insulation film having a dielectric constant ($\in$) of approximately 2.5 was formed when optimizing film formation conditions.

However, the above-mentioned conventional approaches have the following problems:

In the case of the inorganic SOG insulation film formed by the spin-coat method, there are problems in that the materials properties are not distributed equally on a silicon substrate and that an apparatus used for a curing process after coating the material is expensive.

In the case of the fluorinated amorphous carbon film formed by the plasma CVD method using CxFyHz as a source gas, there are problems such as low heat resistance (370° C. or lower), poor adhesion with silicon materials, and low mechanical strength of the film formed.

Furthermore, among silicon-containing hydrocarbons, when P-TMOS is used, a polymerized oligomer cannot form a linear structure such as a siloxane polymer because P-TMOS contains three alkoxy groups. Consequently, a porous structure is not formed on a silicon substrate, and hence a dielectric constant cannot be reduced to a desired degree.

When a silicon-containing hydrocarbon containing plural alkoxy groups is used, a polymerized oligomer can form a linear structure such as a siloxane polymer by optimizing film formation conditions. Consequently, a porous structure can be formed on a silicon substrate and a dielectric constant can be reduced to a desired degree. However, there are problems in that for a porous structure, a gas, a solvent and an atom/ion, etc. (metals such as Cu, and nitrogen, etc.) can easily diffuse into the film.

SUMMARY OF THE INVENTION

Consequently, in an aspect, an object of the present invention is to provide a method for fabricating a semiconductor device, comprising: (a) forming on a substrate a silicon-containing insulation film having a diffusion coefficient of about 250 $\mu m^2$/min or less as measured using isopropyl alcohol, by plasma reaction using a reaction gas comprising (i) a source gas comprising a silicon-containing hydrocarbon compound containing plural cross-linkable groups, (ii) a cross-linking gas, (iii) an inert gas, and optionally (iv) an oxygen-supplying gas, wherein a flow rate of the oxygen-supplying gas is no more than 25% of that of the source gas; and (b) subjecting the insulation film to an integration process (optionally including a post-deposition treatment of the film such as UV-cure) to fabricate a semiconductor device.

The above embodiment includes, but is not limited to, the following embodiments:

The integration process may be at least one selected from the group consisting of etching, ashing, chemical washing, ALD (atomic layer deposition)-barrier metal deposition, CMP, resist formation, and rinsing.

The method may further comprise repeating steps (a) and (b).

The silicon-containing insulation film may have a dielectric constant of 2.9 or less.

The flow of oxygen-supplying gas may be less than that of the cross-linking gas and that of the inert gas, respectively. The cross-linkable groups of the silicon-containing hydrocarbon compound may be alkoxy groups and/or vinyl groups. The cross-linking gas may be selected from the group consisting of alcohol, ether, unsaturated hydrocarbon, $CO_2$, and $N_2$. The alcohol may be selected from the group consisting of $C_{1-6}$ alkanol and $C_{4-12}$ cycloalkanol. The ether may be selected from the group consisting of $C_{3-20}$ ether and $C_{5-12}$ cycloalkanol vinyl compounds. The source gas may be a compound having the formula $Si_\alpha O_{\alpha-1} R_{2\alpha-\beta+2}(OC_n H_{2n+2})_\beta$ wherein $\alpha$ is an integer of 1-3, $\beta$ is 2 or 3, n is an integer of 1-3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I. The flow rate of the cross-linking gas may be 20-500% of that of the source gas.

The plasma reaction may be conducted using radio-frequency power having an intensity of 1.5 W/$cm^2$ or higher. The radio-frequency power may be a combination of high-frequency power and low-frequency power. The intensity of the high-frequency power may be 1.5 W/$cm^2$ or higher, and the intensity of the low-frequency power is 0.01 W/$cm^2$ or higher.

The flow rate of the inert gas may be 15-300% of that of the source gas. The reaction gas may be excited upstream of the reaction chamber.

In another aspect, the present invention provides a method for fabricating a semiconductor device, comprising: (a) forming on a substrate a silicon-containing insulation film having a dielectric constant of about 2.9 or less and a diffusion coefficient of about 250 $\mu m^2$/min or less as measured using isopropyl alcohol, by plasma reaction using a reaction gas comprising (i) a source gas comprising a silicon-containing hydrocarbon compound containing plural cross-linkable groups, (ii) a cross-linking gas, (iii) an inert gas, and optionally (iv) an oxygen-supplying gas, wherein a flow rate of the oxygen-supplying gas is no more than 25% of that of the source gas, under conditions where if the flow of the oxygen-supplying gas increases, the dielectric constant of the forming film decreases (and the diffusion coefficient increases); and (b) subjecting the insulation film to an integration process (optionally including a post-deposition treatment such as UV-cure) to fabricate a semiconductor device.

The above embodiment includes, but is not limited to, the following embodiments:

The conditions may comprise controlling a flow of the source gas at 50-500 sccm; a flow of the cross-linking gas at 20-500% of that of the source gas; a flow rate of the inert gas at 15-300% of that of the source gas; the flow of the oxygen-supplying gas less than that of the cross-linking gas and that of the inert gas, respectively; an RF power at 1.5 W/cm$^2$ or higher; a pressure at 100-1,200 Pa; a temperature at 150-450° C. The flow of the cross-linking gas may be greater than that of the source gas and that of the inert gas, respectively. The flow of the oxygen-supplying gas may be zero. The integration process may be at least one selected from the group consisting of etching, ashing, chemical washing, ALD-barrier metal deposition, CMP, resist formation, and rising. The method may further comprise repeating steps (a) and (b).

In all of the aforesaid embodiments, any element used in an embodiment can interchangeably be used in another embodiment unless such a replacement is not feasible or causes adverse effect. Further, the present invention can equally be applied to apparatuses and methods.

In at least one embodiment, an insulation film having a low dielectric constant can easily be formed without increasing apparatus costs.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
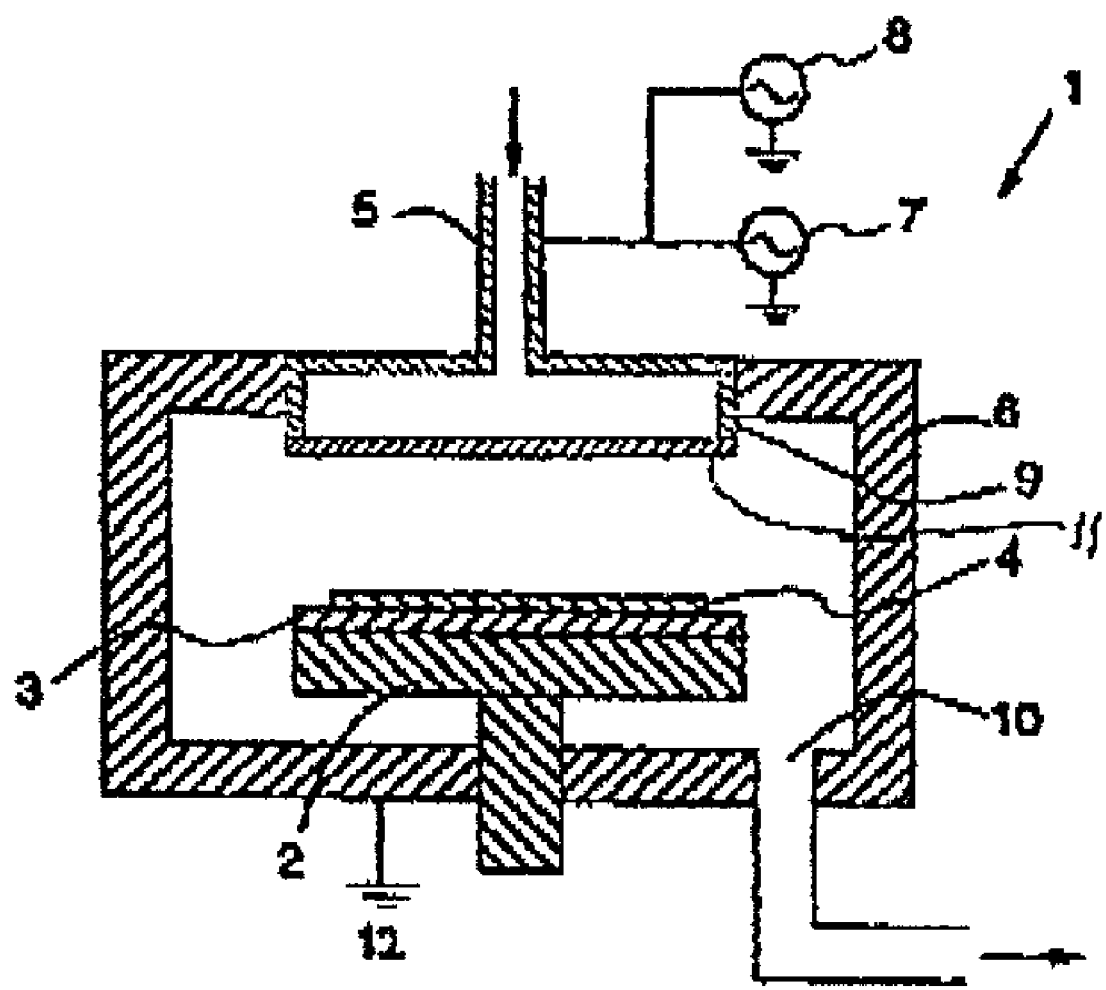
FIG. 1 is a schematic is a schematic diagram of the plasma CVD apparatus usable in an embodiment of the present invention.

As described above, in an embodiment of the present invention, an object of the present invention is to provide a method of forming an insulation film having a low dielectric constant and high diffusion resistance function. The diffusion resistance (barrier) function can be determined by a method disclosed in References (1) and (2) below, the disclosure of which is incorporated herein by reference: (1) D. Shamiryan, T. Abellc, Q. T. Lea, and K. Macx (Microelectronic Engineering 70/2-4 (2003) 341-345), "Pinhole density measurements of barriers deposited on low-k films"; (2) Konstantin P. MOGILNIKOV, Mikhail R. BAKLANOV, Denis SHAMIRYAN and Mihail P. PETKOV (Japanese Journal of Applied Physics Vol. 43, No. 1, 2004, pp. 247-248), "A Discussion of the Practical Importance of Position Annihilation Lifetime Spectroscopy Percolation Threshold in Evaluation of Porous Low-K Dielectrics".

The Shamiryan reference above indicates that SiOCH (silicon oxycarbon, 7% porosity) has a diffusion coefficient of about 3,000 $\mu m^2$/min (using toluene), and MSQ (mehtylsilsesquioxane, 40% porosity) has a diffusion coefficient of about 500,000 $\mu m^2$/min (using toluene).

In general, the higher the porosity of a film, the higher the diffusion coefficient becomes, because the film having a high porosity possesses high pore interconnectivity which can serve as channels for ions and molecules to flow. However, in general, the lower the porosity of a film, the higher the dielectric constant becomes, because pores have a dielectric constant of nearly one, films having a low pore volume tend to have a higher dielectric constant. Thus, it is difficult to produce a film having a low dielectric constant and a low diffusion coefficient. When a film having a high diffusion coefficient is subjected to integration processes, the intended characteristics of a fabricated device may not be obtained.

In an embodiment, a low-dielectric constant may be accomplished by formation of oligomers (e.g., siloxane polymers) composed of residues of silicon-containing hydrocarbons each having two or more alkoxy groups, and a diffusion blocking function is accomplished by controlling the porous structure.

In a preferred embodiment of the present invention, an insulation film can be obtained which has a dielectric constant of about 2.9 or lower (including 2.8, 2.7, 2.6, 2.5, 2.4, 2.3, 2.2, 2.1, 2.0, and numbers between any two of the foregoing) and a diffusion resistance function with a diffusion coefficient of isopropyl alcohol of about 250 μm²/min or less (including 200, 150, 100, 50, and numbers between any two of the foregoing), depending on the type of source gas, cross-linking gas, oxygen-supplying gas, and the intensity of RF power, for example. In an embodiment, these films may have a porosity of about 5% to about 35%, preferably about 5% to about 20%.

These films can be produced as follows, for example. These embodiments are not intended to limit the present invention.

A method of forming an insulation film having a low-dielectric constant by a plasma CVD method comprises the steps of: introducing a source gas comprising a silicon-containing hydrocarbon having cross-linkable groups such as plural alkoxy groups and/or vinyl groups, a cross-linking gas, an inert gas, and optionally an oxygen-supplying gas (less than 25% of source gas flow, preferably zero), into a reaction chamber; applying radio-frequency power by overlapping first radio-frequency power and second radio-frequency power or applying the first radio-frequency power alone for generating a plasma reaction field inside the reaction chamber; and optimizing the flow rates of respective source gases and the intensity of each radio-frequency power.

As the source gas, a silicon-containing hydrocarbon having plural cross-linkable groups may be used singly or in combination with one or more other silicon-containing hydrocarbons such as those having one or more cross-linkable groups. The cross-linkable groups include, but are not limited to, alkoxy groups and/or vinyl groups. For example, if a silicon-containing hydrocarbon having no or one alkoxy group is exclusively used, a linear siloxane oligomer can be formed when supplementing oxygen using an oxygen-supplying gas as necessary. However, in that case, it is difficult to cross-link oligomers by using a cross-linking gas in order to increase a diffusion resistance function of a resultant film. A silicon-containing hydrocarbon having no or one alkoxy group can be used in an amount less than a silicon-containing hydrocarbon having two or more alkoxy groups.

In an embodiment, 10% or more (including 15%, 20%, 25%, 30%, 40%, 50%, 60%, 70%, 80%, 90%, and 100%) of the source gas may be a silicon-containing hydrocarbon having two alkoxy groups in order to predominantly or significantly form linear oligomers. Preferably, as the source gas, the silicon-containing hydrocarbon having plural alkoxy groups is a linear compound such as dimethyldimethoxysilane (DM-DMOS) or 1,3-dimethoxy-tetramethyldisiloxane (DMOTMDS). A silicon-containing hydrocarbon having a cyclic main structure may be used in an amount less than a linear silicon-containing hydrocarbon. In the above, alkoxy groups include $-OC_nH_{2n+1}$ (n is an integer of 1-4). The source gas can be a compound containing vinyl groups such as 1,3-divinyltetramethyldisiloxane, and similarly to a compound having alkoxyl groups, the compound can form oligomers.

As the cross-linking gas ("cross-linker"), any suitable reactive gas such as $CO_2$, ethylene glycol, 1,2-propanediol, isopropyl alcohol (IPA), ethylene, $N_2$ or diethyl ether can be used which can cross-link oligomers of silicon-containing hydrocarbon. For example, any suitable alcohol, ether, and/or unsaturated hydrocarbon can be used, which include an alcohol selected from the group consisting of $C_{1-6}$ alkanol and $C_{4-12}$ cycloalkanol, and the unsaturated hydrocarbon selected from the group consisting of $C_{1-6}$ unsaturated hydrocarbon, $C_{4-12}$ aromatic hydrocarbon unsaturated compounds, and $C_{4-12}$ alicyclic hydrocarbon unsaturated compounds. In the foregoing, compounds having a higher number of carbon atoms include, but are not limited to: 1,4-cyclohexane diol (b.p. 150° C./20 mm), 1,2,4-trivinylcyclohexane (b.p. 85-88° C./20 mm), 1,4-cyclohexane dimethanol (b.p. 283° C.), and 1,3-cyclopentane diol (80-85° C./0.1 Torr). Further, compounds having plural reactive groups ('mixed' functionalities, i.e., unsaturated hydrocarbon and alcohol functionalities) can also be used as cross-linkers, which include, but are not limited to: $C_{3-20}$ ether such as ethylene glycol vinyl ether $H_2C=CHOCH_2OH$ (b.p. 143° C.), ethylene glycol divinyl ether $H_2C=CHOCH_2CH_2OCH=CH_2$ (b.p. 125-127° C.), and 1,4-cyclohexane dimethanol divinyl ether (b.p. 126° C./14 mm) ($H_2C=C(OH)-CH_2)_2-(CH_2)_6$); and $C_{5-12}$ cycloalkanol vinyl compounds such as 1-vinylcyclohexanol (b.p. 74° C./19 mm). Usable reactive gases are not limited to the above and will be explained below. As an inert gas, Ar, Ne, and/or He may be used. Further, as an oxygen-supplying gas, $O_2$, NO, $O_3$, $H_2O$ or $N_2O$ can be included to supply oxygen in the source gas if sufficient oxygen atoms are not present in the silicon-containing hydrocarbon.

In an embodiment, by overlapping high-frequency RF power and low-frequency RF power, the cross-linking of oligomers can effectively be performed. For example, a combination of high-frequency RF power having 2 MHz or higher frequencies and low-frequency RF power having less than 2 MHz frequencies can be used. The low-frequency RF power is effective even at a low power level such as 0.5 W/cm² or lower (including 0.2, 0.1, 0.075, 0.05, 0.025 W/cm², and numbers between any two of the foregoing). In contrast, the high-frequency RF power is applied at a high power level such as 1.5 W/cm² or higher (including 2.0, 2.25, 2.5, 2.75, 3.0, 3.25, 3.5 W/cm², and numbers between any two of the foregoing). Such a high power level can increase the growth speed of a resultant insulation film.

According to an embodiment of the present invention, a silicon-containing insulation film can be formed on a substrate, which film is a plasma polymerization product obtainable by the above-mentioned method. The plasma polymerization product has a structure where silicon-containing hydrocarbon compounds each containing plural alkoxy groups are cross-linked using a cross-linking agent selected from the group consisting of $C_{1-6}$ alkanol, $C_{1-6}$ ether, $C_{1-6}$ unsaturated hydrocarbon, $CO_2$, and $N_2$. The plasma polymerization product may have a diffusion resistance function with a diffusion coefficient of isopropyl alcohol of 250 μm²/min or less (including 200, 150, 100, 50, and numbers between any two of the foregoing) and a dielectric constant of 2.9 or lower, for example, depending on the type of source gas, cross-linking gas and oxygen-supplying gas and the plasma polymerization conditions. In the present invention, polymerization includes oligomerization, and oligomers include structures of $(M)_n$ (M is a constituent unit, n is an integer of 2-50, including ranges of 5-30 and 10-20).

Further aspects, features and advantages of this invention will become apparent from the detailed description of preferred embodiments which follow.

In an embodiment of the present invention, a method is provided to form a silicon-containing insulation film on a substrate by plasma reaction, comprising the steps of: (a) introducing a reaction gas comprising (i) a source gas comprising a silicon-containing hydrocarbon compound containing plural cross-linkable groups, (ii) a cross-linking gas, and (iii) an inert gas, into a reaction chamber where a substrate is placed; (b) applying radio-frequency power to generate a plasma reaction field inside the reaction chamber; and (c) controlling a flow rate of the reaction gas and an intensity of the radio-frequency power. In an embodiment, the method forms a silicon-containing insulation film on a substrate by plasma reaction, comprising the steps of: (A) introducing a reaction gas comprising (I) a source gas comprising at least one silicon-containing hydrocarbon compound containing plural alkoxy groups, (II) a cross-linking gas selected from the group consisting of $C_{1-6}$ alkanol, $C_{1-6}$ ether, $C_{1-6}$ unsaturated hydrocarbon, $CO_2$, and $N_2$, and (III) an inert gas, into a reaction chamber where a substrate is placed; (B) applying radio-frequency power to create a plasma reaction space inside the reaction chamber; and (C) controlling a flow rate of the reaction gas and an intensity of the radio-frequency power.

As described above, the present invention includes various embodiments. For example, the radio-frequency power may be a combination of high-frequency power and low-frequency power. Further, the high-frequency power may have a frequency of 2 MHz or higher (including 5, 10, 15, 20, 25, 30, 40, 50, 60, and 70 MHz, and numbers between any two of the foregoing), and the lower-frequency power has a frequency of less than 2 MHz (including 1 MHz, 800, 600, 400, 200, 100 KHz, and numbers between any two of the foregoing). Alternatively, the radio-frequency power can be a single frequency power. The intensity of the radio-frequency power may be 1.5 W/cm$^2$ or higher, and when overlapping low-frequency RF power, the intensity of the high-frequency power may be 1.5 W/cm$^2$ or higher, and the intensity of the low-frequency power may be 0.01 W/cm$^2$ or higher. More than two RF power frequencies can be overlapped. For example, high-frequency power (e.g., 20-30 MHz), intermediate-frequency power (e.g., 1-5 MHz), and low-frequency power (e.g., 200-800 kHz) can be overlapped. In embodiment, the intensity of RF power is less than 10 W/cm$^2$, preferably 5 W/cm$^2$.

The source gas may be a compound having the formula $Si_\alpha O_{\alpha-1} R_{2\alpha-\beta+2}(OC_n H_{2n+1})_\beta$ wherein $\alpha$ is an integer of 1-3, $\beta$ is 2 or 3, n is an integer of 1-3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I. In an embodiment, R may be $C_{1-6}$ hydrocarbon. The source gas can also be comprised of a mixture of one or more of the compounds described by the formula above. In an embodiment, $\alpha$ is 1 or 2, and $\beta$ is 2. This type of source gas is disclosed in U.S. Pat. No. 6,352,945, U.S. Pat. No. 6,383,955, and U.S. Pat. No. 6,432,846, all of which are incorporated herein by reference in their entirety. In embodiments, the source gas may be dimethyl-dimethoxysilane (DM-DMOS), 1,3-dimethoxytetramethyldisiloxane (DMOTMDS), or phenylmethyl dimethoxysilane (PM-DMOS). Different source gases can be mixed or a single source gas can be used alone. An additional molecule that might be a useful additive to the sources listed above is 1,3-divinyl tetramethylsilane (DVTMS, $[CH_2=CH_2Si(CH_3)_2]_2O$). Such a silicon-containing compound having unsaturated hydrocarbons can be useful to improve the diffusion blocking function by promoting cross-linking molecules.

The flow rate of a reaction gas and the intensity of RF power are controlled so as to form an insulation film having a solvent diffusion resistance function of 250 μm$^2$/min or less.

The inert gas can be any suitable inert gas including Ar, Ne and He. The reaction gas may further comprise an oxygen-supplying gas. The oxygen-supplying gas can be any suitable gas which can supply oxygen and may include $O_2$, NO, $O_3$, $H_2O$ and $N_2O$. In an embodiment, the oxygen-supplying gas may be supplied at a flow rate less than that of the source gas. The inert gas may be supplied at a flow rate of 15-300% (50% or more in an embodiment) of that of the source gas.

In an embodiment, the cross-linking gas may be a $C_{2-4}$ alkanol such as ethylene glycol, 1,2-propanediol, and isopropyl alcohol. In another embodiment, the cross-linking gas may be a $C_{2-4}$ ether such as diethyl ether. In still another embodiment, the cross-linking gas may be a $C_{2-4}$ unsaturated hydrocarbon such as $C_2H_4$, $C_3H_4$, $C_3H_6$, $C_4H_8$, $C_3H_5(CH_3)$, and $C_3H_4(CH_3)_2$. Compounds having a skeleton of a higher number of carbon atoms such as $C_{4-12}$ aromatic hydrocarbons and $C_{4-12}$ alicyclic hydrocarbons can also be used as cross-linkers if they posses reactive groups, which compounds include, but are not limited to: $C_{4-12}$ cycloalkanol such as 1,4-cyclohexane diol (b.p. 150° C./20 mm), 1,4-cyclohexane dimethanol (b.p. 283° C.), and 1,3-cyclopentane diol (80-85° C./0.1 Torr); and $C_{4-12}$ alicyclic hydrocarbon unsaturated compounds such as 1,2,4-trivinylcyclohexane (b.p. 85-88° C./20 mm).

Further, compounds having plural reactive groups ('mixed' functionalities, i.e., unsaturated hydrocarbon and alcohol functionalities) can also be used as cross-linkers, which include, but are not limited to: $C_{3-20}$ ether such as ethylene glycol vinyl ether $H_2C=CHOCH_2OH$ (b.p. 143° C.), ethylene glycol divinyl ether $H_2C=CHOCH_2CH_2OCH=CH_2$ (b.p. 125-127° C.), and 1,4-cyclohexane dimethanol divinyl ether (b.p. 126° C./14 mm) ($H_2C=C(OH)-CH_2)_2-(CH_2)_6$); and $C_{5-12}$ cycloalkanol vinyl compounds such as 1-vinylcyclohexanol (b.p. 74° C./19 mm). The higher-molecular weight type sources identified above can incorporate the desired cross-linking ligands in combination with cyclic compounds. These enable the achievement of the desired enhancement in the diffusion resistance function without compromising the dielectric constant because they can cross-link the linear siloxane chains, but also reduce the density of the films to a higher degree than other types of sources.

The cross-linking gas can be used singly or in any combination of the foregoing. The cross-linking gas may be supplied at a flow rate effective to cross-link oligomers of compounds of the source gas, thereby increasing the diffusion resistance function of an insulation film formed on the substrate. The flow rate of the cross-linking gas may be 20-500% of that of the source gas, depending on, for example, the type of source gas.

In an embodiment, the reaction gas is excited upstream of the reaction chamber. In this embodiment, the reaction gas can be excited in a remote plasma chamber installed upstream of a reactor. The source gas and the additive gas (the cross-linking gas and/or the inert gas) can be introduced into the remote plasma chamber. In this case, a reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent application Ser. No. 09/511,934 filed Feb. 24, 2000, U.S. Pat. No. 6,736,147, U.S. Pat. No. 5,788,778, and U.S. Pat. No. 5,788,799. The disclosure of each of the above is incorporated herein by reference in its entirety.

Further, the excitation of the reaction gas may comprise exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber. Alternatively, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heater chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

Further, the excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction gas flows into the reactor for deposition of a film. In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber.

In another embodiment, alternative plasma conditions such as use of pulsed plasma for the high and/or low frequency radiation can be employed for further stabilization of film deposition. For example, cycles of 10-100 msec and a duty (radiation period/(radiation period+non-radiation period)) of 10-90% may be preferable.

In another aspect of the present invention, a method is provided to increase a diffusion resistance function of a silicon-containing insulation film formed on a substrate, comprising the steps of: (a) mixing a cross-linking gas selected from the group consisting of $C_{1-6}$ alkanol, $C_{1-6}$ ether, $C_{1-6}$ unsaturated hydrocarbon, $CO_2$, and $N_2$, into a source gas comprising a silicon-containing hydrocarbon compound containing plural alkoxy groups, with an inert gas; (b) introducing the mixture gas as a reaction gas into a reaction chamber where a substrate is placed; (c) applying radio-frequency power to create a plasma reaction field inside the reaction chamber; and (d) controlling a flow rate of the reaction gas and an intensity of the radio-frequency power.

In order to form oligomers in the present invention, the residence time of a reaction gas may be controlled as disclosed in U.S. Pat. No. 6,352,945, U.S. Pat. No. 6,383,955, and U.S. Pat. No. 6,432,846, all of which are incorporated herein by reference in their entirety.

The flow rate of the reaction gas is determined based on the intensity of RF power, the pressure selected for reaction, and the type of source gas and cross-linking gas. The reaction pressure is normally in the range of 100-1200 Pa, preferably 400-1100 Pa, so as to maintain a stable plasma. This reaction pressure is relatively high in order to lengthen the residence time of the reaction gas. The total flow of the reaction gas is important for reducing the relative dielectric constant of a resulting film. In general, the longer the residence time is, the lower the relative dielectric constant becomes. The source gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the source gas (preferably 100-500 sccm, including 150, 200, 250 sccm) is expected to be included in the reaction gas.

In order to adjust the reaction in the vapor phase, it is effective to add a small amount of an inert gas to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the source gas in the vapor phase can be controlled. Additionally or alternatively, neon (Ne) can be used for the same purpose. Molecules of the reaction gas undergo polymerization in the vapor phase, thereby forming oligomers. The oligomers are expected to have an O:Si ratio of 1:1. However, when the oligomers form a film on the substrate, the oligomers undergo further polymerization, resulting in a higher oxygen ratio. The ratio varies depending on the relative dielectric constant or other characteristics of a film formed on the substrate. In view of the above and also reaction efficacy, oxygen is supplied to control a Si/O ratio in the reaction gas and a porous structure. However, to increase the diffusion resistance function, the oxygen flow needs to be controlled.

The present invention will be further described in detail by referring to the figures. FIG. 1 is a schematic illustration of a conventional plasma CVD film-formation apparatus. The plasma CVD film-formation apparatus 1 includes a reaction chamber 6, a gas inlet port 5, a susceptor 3, and a second electrode comprising a heater 2. From a gas line (not shown), a reaction gas is introduced through the gas inlet port 5. A circular first electrode 9 is disposed immediately below the gas inlet port 5; the first electrode 9 has a hollow structure, and a large number of fine holes are provided at its bottom, through which a reaction gas is jetted out toward a workpiece 4. Additionally, the first electrode 9 has a structure in which a shower plate 11 having plural gas inlet pores is replaceable in order to reduce component costs. Further at the bottom of the reaction chamber 6, an exhaust port 10 is provided. To this exhaust port 10, an external vacuum pump is connected; consequently, the interior of the reaction chamber 6 is exhausted. The susceptor 3 for placing a workpiece 4 thereon is disposed parallel to and facing the first electrode 9. The workpiece 4 is heated by the heater 2 continuously; and the substrate 4 is maintained at a given temperature (150-450° C.). The gas inlet port 5 and the first electrode 9 are electrically insulated from the reaction chamber 6, and connected to a first radio-frequency power source 7. At this time, a second radio-frequency power source 8 may also be connected. Symbol 12 indicates grounding. Thus, the first electrode 9 and the second electrode function as radio-frequency electrodes and generate a plasma reaction field in the vicinity of the workpiece 4. The type and characteristics of a resulting film vary depending on the type and a flow rate of source gas, a temperature, the type of RF frequency, plasma space distribution and electric potential distribution. Additionally, at the bottom of the reaction chamber 6, an exhaust port 10 is provided and connected to an external vacuum pump (not shown).

The method of forming an insulation film having a low-dielectric constant according to an embodiment of the present invention is described below. The method includes a process of introducing a reaction gas comprised of a primary source gas, a secondary source gas (a cross-linking gas and optionally an oxygen-supplying gas), and an additive gas (an inert gas) into the first electrode 9 through the reaction gas inlet port 5. A primary source gas is a silicon-containing hydrocarbon having plural alkoxy groups, and preferably is dimethyl-dimethoxysilane (DM-DMOS). A secondary source gas is $CO_2$, or alcohol such as ethylene glycol, 1,2 propanediol and isopropyl alcohol (IPA), a hydrocarbon such as ethylene containing at least one unsaturated bond, $N_2$, or ether such as diethyl ether. When controlling a Si/O ratio is required, $O_2$, $O_3$, NO, $H_2O$ or $N_2O$ can be further added as a secondary source gas. An additive gas is an inert gas such as Ar, Ne, and/or He.

Using ramped or different gas flows and/or alternative combinations of gases independently can be useful in order to produce materials with graded and/or different compositions at these surfaces, particularly at the initial interface of the film and at the final top surface.

Additionally, the method of forming an insulation film having a low-dielectric constant according to an embodiment of the present invention includes a process of applying radio-frequency power by overlapping a first radio-frequency power and a second radio-frequency power or a process of applying the first radio-frequency power alone to the first electrode 9. A frequency of the first radio-frequency power source 7 is preferably 2 MHz or higher. A frequency of the second radio-frequency power source 8 is preferably 2 MHz or lower. By applying the radio-frequency power to the first electrode 9, a plasma reaction field is formed in the vicinity of the semiconductor wafer 4. The reaction gas introduced through the reaction gas inlet port 5 is excited into plasma, and a desired insulation film is formed on the semiconductor wafer.

With the method according to an embodiment of the present invention, by introducing $CO_2$, alcohol such as ethylene glycol, 1,2 propanediol and isopropyl alcohol (IPA), a hydrocarbon such as ethylene containing at least one unsaturated bond, $N_2$, or ether such as diethyl ether as a secondary source gas, linear oligomers are cross-linked and the diffusion blocking resistance of a film can be improved while a low dielectric constant is maintained. Additionally, by overlapping the first radio-frequency power and the second radio-frequency power, the diffusion resistance function of the film can be further improved.

Furthermore, the method of forming an insulation film having a low-dielectric constant according to an embodiment of the present invention includes a process of optimizing a flow rate of respective source gases and the output of the first and the second radio-frequency power sources. Examples of optimizing the output was performed as described below. In these examples, a frequency of the first radio-frequency power source 7 was fixed at 27.12 MHz; a frequency of the second radio-frequency power source 8 was fixed at 400 kHz. Frequencies other than these can be used.

In the present invention, in a first step, a silicon-containing insulation film having a diffusion coefficient of about 250 $\mu m^2/min$ or less as measured using isopropyl alcohol is formed on a substrate, wherein a flow rate of the oxygen-supplying gas is no more than 25% of that of the source gas, e.g., under conditions where if the flow of the oxygen-supplying gas increases, the dielectric constant of the forming film decreases. In a second step, the insulation film is subjected to an integration process to fabricate a semiconductor device. The integration process may be at least one selected from the group consisting of etching, ashing, chemical washing, ALD-barrier metal deposition, CMP, resist formation, and rising. These processes are processes adversely affecting the quality of a fabricated semiconductor device if the diffusion coefficient of a low-k film is high. The following are embodiments of these processes and do not intend to limit the present invention.

In an embodiment of etching, after patterning an applied resist, a low-k film is etched using an etching gas comprised of a fluorocarbon type gas and an oxygen type gas. The fluorocarbon type gas includes, but is not limited to, $CF_4$, $C_2F_4$, $C_2F_6$, $C_4F_6$, and $C_5F_8$. The oxygen type gas includes, but is not limited to, $O_2$. As an additive gas, Ar, He, $N_2$, and the like can be used. By controlling the plasma conditions and the gas ratio, a ratio of $CF_2/F$ present in a plasma is adjusted. $CF_2$ is accumulated in the form of polymer on a side wall of a portion to be etched, thereby controlling a configuration of the etch pattern. Due to F radicals (very few O radicals), the characteristics of the side wall of the film deteriorate, which exhibits moisture absorbability and increased dielectric constant. Further, its mechanical strength is decreased. If the diffusion coefficient of the film is higher than 250 $\mu m^2/min$, the thickness of a layer of the film whose characteristics are deteriorated increases. The above phenomena occurs when using an etching gas comprised of a hydrogen type gas and an oxygen type gas.

In an embodiment of ashing, after etching, the resist is removed. Typically, $O_2$ or $H_2O$ plasma is used. Due to O radicals, $CH_3$ group is dissociated and oxidized, thereby increasing hydrophilicity and dielectric constant. If the diffusion coefficient of the film is higher than 250 $\mu m^2/min$, the thickness of a layer of the film whose characteristics are negatively affected increases.

In an embodiment of chemical washing, the remaining resist which remains after the ashing and the polymer accumulated on the side wall are removed. An amino alcohol type reagent or florin type reagent can be used. By the reagent, the attack of an etch damaged film, structural changes including, for example, an increase of Si—OH bonds (hydrophilization), and the increase of dielectric constant can occur. If the diffusion coefficient of the film is higher than 250 $\mu m^2/min$, the thickness of a layer of the film which can be attacked and whose characteristics can deteriorate, increases.

In an embodiment of ALD-barrier metal deposition, a metal material is deposited on the etched low-k side wall and, without protecting layers or post etch treatments, can penetrate a porous low-k insulation film, thereby deteriorating its electric properties and reducing the interconnect reliability. If the diffusion coefficient of the film is higher than 250 $\mu m^2/min$, the deterioration of its electric properties and reduction of the interconnect reliability become significant.

In an embodiment of CMP, after filling a hole with Cu, the surface is subjected to CMP using a slurry for CMP. If the diffusion coefficient of the film is higher than 250 $\mu m^2/min$, the adhesion of the film becomes lowered and penetration of the CMP slurry into the low-k film can occur, having a negative impact on the interconnect electrical performance.

Also in an embodiment of resist formation and rinsing in a rinsing chamber, the diffusion coefficient of higher than 250 $\mu m^2/min$ adversely affects the characteristics of the resultant films, resulting in, for example, an increased dielectric constant and deteriorated electrical properties.

As the integration processes, single or dual damascene disclosed in U.S. Pat. No. 5,246,885, No. 5,262,354, No. 6,100,184, No. 6,140,226, No. 6,177,364, No. 6,211,092, and No. 6,815,332, for example, can be used. The disclosure of the above patents is incorporated herein by reference in their entirety.

EXAMPLES

Examples of optimizing a flow rate of respective gases and the output of respective radio-frequency power sources in the method of forming an insulation film having a low-dielectric constant according to the present invention were performed as follows:

Example 1

Figure 2:
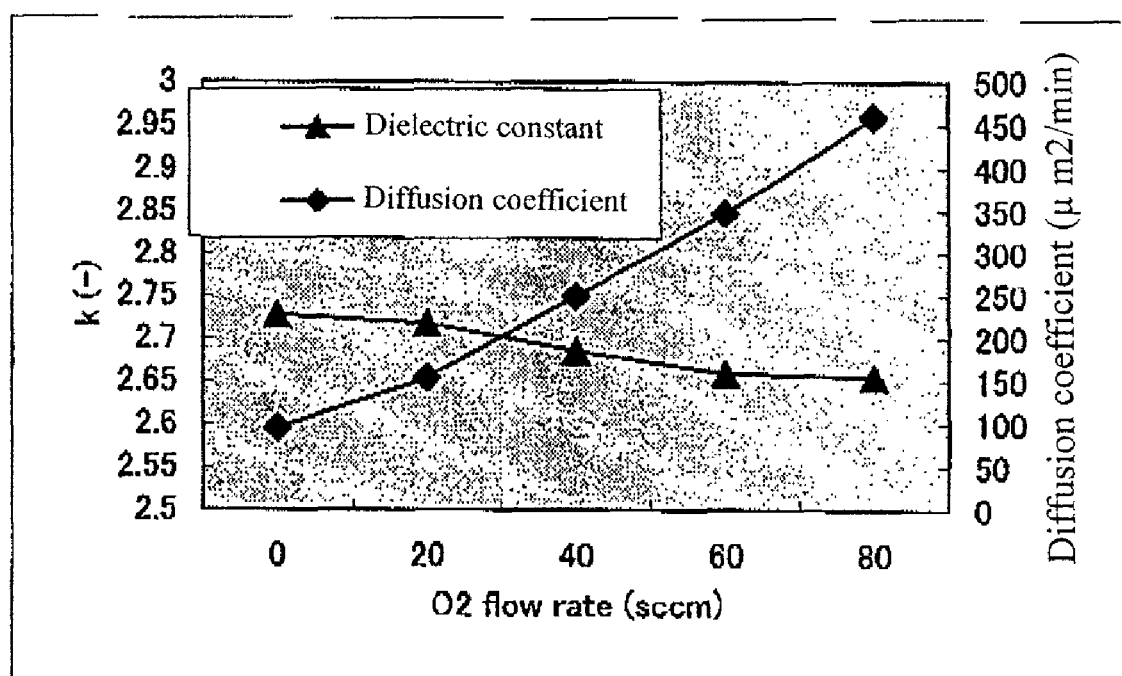
FIG. 2 is a graph showing the relationship between dielectric constants and oxygen flow rates and between diffusion coefficients (diffusion resistance (barrier) function) and oxygen flow rates according to an embodiment of the present invention.

Using the plasma CVD apparatus 1 shown in FIG. 1, an example of forming an insulation film on a Ø300 mm silicon substrate was performed.
Experimental conditions:
Primary gas: DM-DMOS (dimethyl-dimethoxysilane) 180 sccm
Additive gas: He 150 sccm
Secondary gas: Isopropyl alcohol 400 sccm
Oxygen-supplying gas: $O_2$ 0-80 sccm
$1^{st}$ radio-frequency power source: 27.12 MHz 1.9 W/cm$^2$
$2^{nd}$ radio-frequency power source: 400 kHz 0 W/cm$^2$
Pressure: 800 Pa
FIG. 2 is a graph showing the relationship between the dielectric constants and the diffusion resistance function when a flow rate of $O_2$ was altered from 0 to 80 sccm under the above-mentioned experimental conditions. The graph demonstrates that under the above-mentioned experimental conditions, an optimized flow rate of $O_2$ for forming an insulation film having a dielectric constant of 2.9 or lower and a diffusion coefficient of 250 μm$^2$/min or less is 0 to 40 sccm.

Example 2

Figure 3:
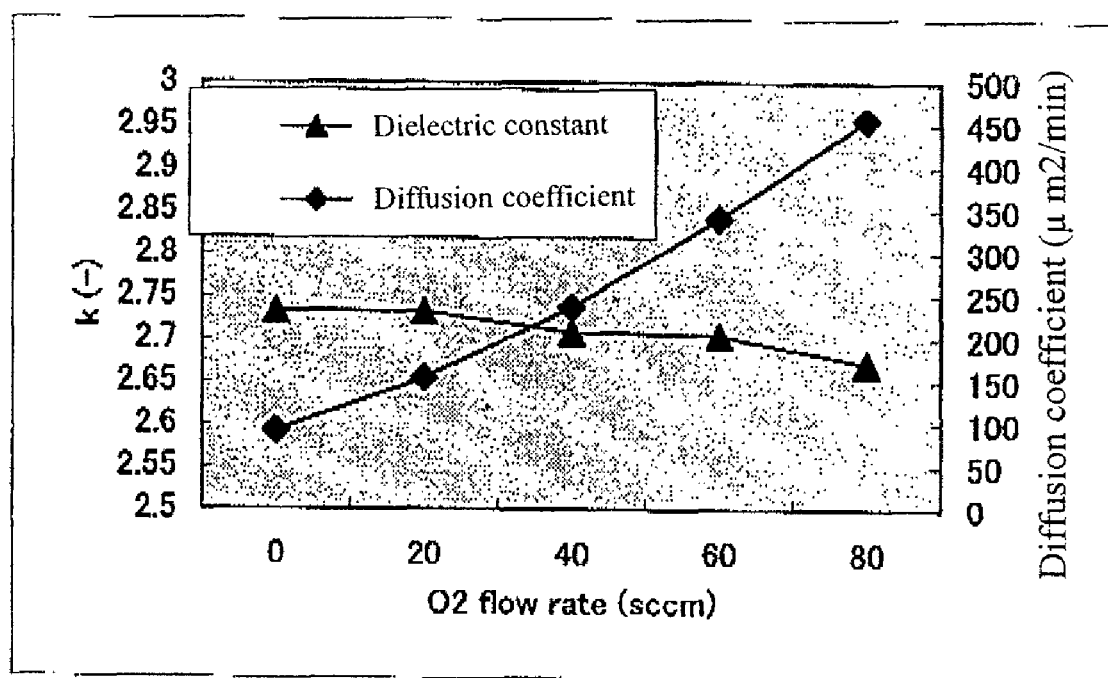
FIG. 3 is a graph showing the relationship between dielectric constants and oxygen flow rates and between diffusion coefficients (diffusion resistance (barrier) function) and oxygen flow rates according to an embodiment of the present invention.

Using the plasma CVD apparatus shown in FIG. 1, an example of forming an insulation film on a Ø300 mm silicon substrate was performed.
Experimental conditions:
Primary gas: DM-DMOS (dimethyl-dimethoxysilane) 180 sccm
Additive gas: He 150 sccm
Secondary gas: Isopropyl alcohol 400 sccm
Oxygen-supplying gas: $O_2$ 0-80 sccm
$1^{st}$ radio-frequency power source: 27.12 MHz 1.9 W/cm$^2$
$2^{nd}$ radio-frequency power source: 400 kHz 0.1 W/cm$^2$
Pressure: 800 Pa
FIG. 3 is a graph showing the relationship between the dielectric constants and the diffusion blocking function when a flow rate of $O_2$ was altered from 0 to 80 sccm under the above-mentioned experimental conditions. The graph demonstrates that under the above-mentioned experimental conditions, an optimized flow rate of $O_2$ for forming an insulation film having a dielectric constant of 2.9 or lower and a diffusion coefficient of 250 μm$^2$ or less is 0 to 40 sccm.

Example 3

Figure 4:
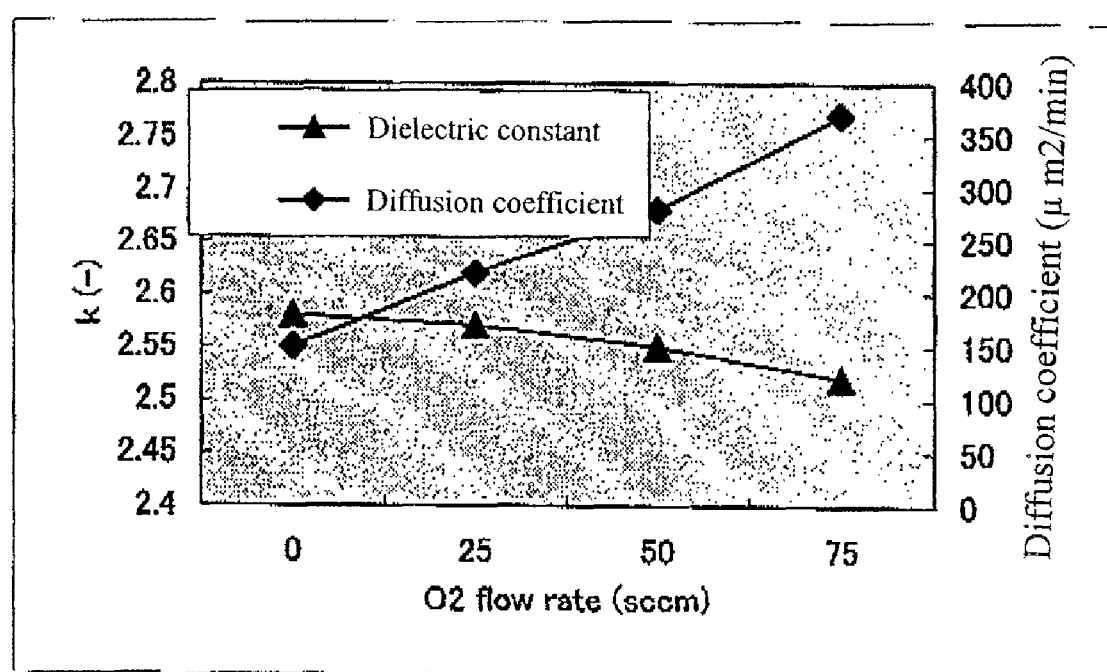
FIG. 4 is a graph showing the relationship between dielectric constants and oxygen flow rates and between diffusion coefficients (diffusion resistance (barrier) function) and oxygen flow rates according to an embodiment of the present invention.

Using the plasma CVD apparatus shown in FIG. 1, an example of forming an insulation film on a Ø300 mm silicon substrate was performed.
Experimental conditions:
Primary gas: DMOTMDS (1,3-dimethoxytetramethyldisiloxane) 100 sccm
Additive gas: He 160 sccm
Secondary gas: Isopropyl alcohol 400 sccm
Oxygen-supplying gas: $O_2$ 0-75 sccm
$1^{st}$ radio-frequency power source: 27.12 MHz 1.8 W/cm$^2$
$2^{nd}$ radio-frequency power source: 400 kHz 0 W/cm$^2$
Pressure: 850 Pa
FIG. 4 is a graph showing the relationship between the dielectric constants and the diffusion blocking function when a flow rate of $O_2$ was altered from 0 to 75 W/cm$^2$ under the above-mentioned experimental conditions. The graph demonstrates that under the above-mentioned experimental conditions, an optimized flow rate of $O_2$ for forming an insulation film having a dielectric constant of 2.7 or lower and a diffusion coefficient of 250 μm$^2$ or less is 0 to 25 sccm.

Example 4

Figure 5:
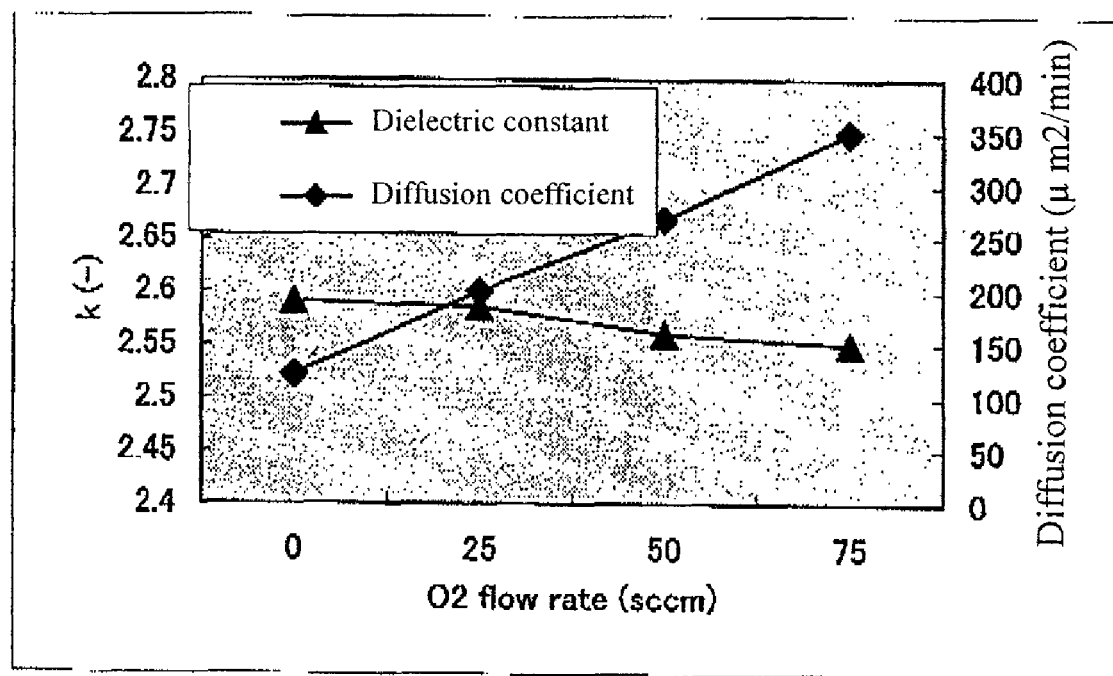
FIG. 5 is a graph showing the relationship between dielectric constants and oxygen flow rates and between diffusion coefficients (diffusion resistance function) and oxygen flow rates according to an embodiment of the present invention.

Using the plasma CVD apparatus shown in FIG. 1, an example of forming an insulation film on a Ø300 mm silicon substrate was performed.
Experimental conditions:
Primary gas: DMOTMDS 100 sccm
Additive gas: He 160 sccm
Secondary gas: Isopropyl alcohol 400 sccm
Oxygen-supplying gas: $O_2$ 0-75 sccm
$1^{st}$ radio-frequency power source: 27.12 MHz 1.8 W/cm$^2$
$2^{nd}$ radio-frequency power source: 400 kHz 0.05 W/cm$^2$
Pressure: 850 Pa
FIG. 5 is a graph showing the relationship between the dielectric constants and the diffusion blocking function when a flow rate of $O_2$ was altered from 0 to 75 W/cm$^2$ under the above-mentioned experimental conditions. The graph demonstrates that under the above-mentioned experimental conditions, an optimized flow rate of $O_2$ for forming an insulation film having a dielectric constant of 2.7 or lower and a diffusion coefficient of 250 μm$^2$ or less is 0 to 25 sccm.

Example 5

Using the plasma CVD apparatus shown in FIG. 1, an example of forming an insulation film on a Ø300 mm silicon substrate was performed.
Experimental conditions:
Primary gas: DM-DMOS 180 sccm
Additive gas: He 150 sccm
Secondary gas: Isopropyl alcohol 400 sccm
Oxygen-supplying gas: $O_2$ 20 sccm
$1^{st}$ radio-frequency power source: 27.12 MHz 1.9 W/cm2
$2^{nd}$ radio-frequency power source: 400 kHz 0 W/cm2
Pressure: 800 Pa
Using the central experimental conditions as the centered conditions, dependency on each parameter was confirmed.
Because dependency on oxygen is the strongest, a wide range of desired film characteristics can be selected if a flow rate of oxygen is selected as a central condition.

TABLE 1

| | | | | | 1st RF | Dielectric | Diffusion |
| | DM-DMOS | He | IPA | Pressure | Power Source | Constant | Coefficient |
| Example | (sccm) | (sccm) | (sccm) | (Pa) | (W/cm$^2$) | (-) | (μm$^2$/min) |
|---|---|---|---|---|---|---|---|
| Part of 1 | 180 | 150 | 400 | 800 | 1.9 | 2.72 | 153.7 |
| 5-2 | 100 | 150 | 400 | 800 | 1.9 | 2.79 | 68.6 |
| 5-3 | 350 | 150 | 400 | 800 | 1.9 | 2.66 | 223.4 |
| 5-4 | 180 | 20 | 400 | 800 | 1.9 | 2.73 | 189.3 |
| 5-5 | 180 | 400 | 400 | 800 | 1.9 | 2.70 | 123.9 |
| 5-6 | 180 | 150 | 40 | 800 | 1.9 | 2.69 | 165.1 |
| 5-7 | 180 | 150 | 1000 | 800 | 1.9 | 2.74 | 112.5 |
| 5-8 | 180 | 150 | 400 | 400 | 1.9 | 2.78 | 122.1 |
| 5-9 | 180 | 150 | 400 | 1100 | 1.9 | 2.65 | 234.8 |
| 5-10 | 180 | 150 | 400 | 800 | 1.5 | 2.68 | 146.8 |
| 5-11 | 180 | 150 | 400 | 800 | 3.0 | 2.80 | 55.5 |

From Table 1, under the above-mentioned experimental conditions, it is seen that it is possible to form an insulation film having a dielectric constant of 2.8 or lower and a diffusion coefficient of 250 μm$^2$ or less.

As described above, using the method of forming a low dielectric constant film according to an embodiment of the present invention, an insulation film having a low dielectric constant and a high diffusion blocking function can be formed by optimizing a flow rate of a gas and a power intensity of a RF power source. Additionally, using the method of forming a low dielectric constant film according to an embodiment of the present invention, a low dielectric constant insulation film can be formed easily without increasing apparatus costs.

The present invention includes the above mentioned embodiments and other various embodiments including the following:

1) In any of the foregoing methods, the cross-linkable groups of the silicon-containing hydrocarbon compound are alkoxy groups and/or vinyl groups.

2) In any of the foregoing methods, the cross-linking gas is selected from the group consisting of alcohol, ether, unsaturated hydrocarbon, $CO_2$, and $N_2$.

3) In Item 2, the alcohol is selected from the group consisting of $C_{1-6}$ alkanol and $C_{4-12}$ cycloalkanol.

4) In Item 2, the unsaturated hydrocarbon is selected from the group consisting of $C_{1-6}$ unsaturated hydrocarbon, $C_{4-12}$ aromatic hydrocarbon unsaturated compounds, and $C_{4-12}$ alicyclic hydrocarbon unsaturated compounds.

5) In Item 2, the ether is selected from the group consisting of $C_{3-20}$ ether and $C_{5-12}$ cycloalkanol vinyl compounds.

6) In any of the foregoing methods, the source gas is a compound having the formula $Si_\alpha O_{\alpha-1} R_{2\alpha-\beta+2}(OC_n H_{2n+1})_\beta$ wherein α is an integer of 1-3, β is 2 or 3, n is an integer of 1-3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I.

7) In Item 6, α is 1 or 2, β is 2.

8) In Item 6, R is $C_{1-6}$ hydrocarbon.

9) In Item 8, the source gas is dimethyl-dimethoxysilane.

10) In Item 6, the source gas is 1,3-dimethoxytetramethyldisiloxane.

11) In any of the foregoing methods, the source gas is 1,3-divinyltetramethyldisiloxane.

12) In any of the foregoing methods, the radio-frequency power is a combination of high-frequency power and low-frequency power.

13) In Item 12, the high-frequency power has a frequency of 2 MHz or higher, and the lower-frequency power has a frequency of less than 2 MHz.

14) In any of the foregoing methods, the radio-frequency power is a single frequency power.

15) In any of the foregoing methods, the flow rate of the reaction gas and the intensity of the power are controlled to form an insulation film having a diffusion resistance function.

16) In any of the foregoing methods, the inert gas is selected from the group consisting of Ar, Ne, and He.

17) In any of the foregoing methods, the oxygen-supplying gas is selected from the group consisting of $O_2$, $O_3$, NO, $H_2O$, and $N_2O$.

18) In any of the foregoing methods, the intensity of the radio-frequency power is 1.5 W/cm$^2$ or higher.

19) In Item 18, the intensity of the high-frequency power is 1.5 W/cm$^2$ or higher, and the intensity of the low-frequency power is 0.01 W/cm$^2$ or higher.

20) In any of the foregoing methods, the flow rate of the inert gas is 15-300% of that of the source gas.

21) In any of the foregoing methods, the cross-linking gas is a $C_{2-4}$ alkanol.

22) In Item 21, $C_{2-4}$ alkanol is ethylene glycol, 1,2 propanediol, or isopropyl alcohol.

23) In any of the foregoing methods, the cross-linking gas is a $C_{2-4}$ ether.

24) In Item 23, the $C_{2-4}$ ether is diethyl ether.

25) In any of the foregoing methods, the cross-linking gas is a $C_{2-4}$ unsaturated hydrocarbon.

26) In Item 25, the $C_{2-4}$ unsaturated hydrocarbon is ethylene.

27) In any of the foregoing methods, the cross-linking gas is supplied at a flow rate effective to cross-link oligomers of compounds of the source gas, thereby increasing hardness of an insulation film formed on the substrate.

28) In Item 27, the flow rate of the cross-linking gas is 20-500% of that of the source gas.

29) In any of the foregoing methods, the reaction gas is excited upstream of the reaction chamber.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for fabricating a semiconductor device, comprising:
   (a) selecting conditions for plasma reaction for depositing a silicon-containing insulation film using a diffusion coefficient of the film as a criterion for selecting the conditions such that the silicon-containing insulation film has a target diffusion coefficient between about 250 $\mu^2$/min and about 50 $\mu^2$/min as measured using isopropyl alcohol, said plasma reaction using a reaction gas comprising (i) a source gas comprising a silicon containing hydrocarbon compound containing plural cross-linkable groups, (ii) a cross linking gas, (iii) an inert gas, and (iv) an oxygen-supplying gas, wherein a flow rate of the oxygen-supplying gas is greater than 0% and no more than 25% of that of the source gas, said selection of the conditions comprising:
      correlating the diffusion coefficient of the film with the flow rate of the oxygen supplying gas and selecting the flow rate of the oxygen-supplying gas using the diffusion coefficient as a criterion to adjust a diffusion coefficient of the film to the target diffusion coefficient based on the correlation between the diffusion coefficient of the film and the flow rate of the oxygen-supplying gas;
   (b) forming on a substrate a silicon-containing insulation film having the target diffusion coefficient between about 250 $\mu^2$/min and about 50 $\mu^2$/min as measured using isopropyl alcohol, using the selected conditions; and,
   (c) subjecting the insulation film to an integration process to fabricate a semiconductor device.

2. The method according to claim 1, wherein the integration process is at least one selected from the group consisting of etching, ashing, chemical washing, ALD-barrier metal deposition, CMP, resist formation, and rinsing.

3. The method according to claim 1, further comprising repeating steps (b) and (c).

4. The method according to claim 1, wherein the silicon-containing insulation film has a dielectric constant of between 2.9 and 2.5.

5. The method according to claim 1, wherein the reaction gas includes the oxygen-supplying gas and the flow of oxygen-supplying gas is less than that of the cross-linking gas and that of the inert gas, respectively.

6. The method according to claim 1, wherein the cross-linkable groups of the silicon-containing hydrocarbon compound are alkoxy groups and/or vinyl groups.

7. The method according to claim 1, wherein the cross-linking gas is selected from the group consisting of alcohol, ether, unsaturated hydrocarbon, $CO_2$, and $N_2$.

8. The method according to claim 7, wherein the cross-linking gas is the alcohol and selected from the group consisting of $C_{1-6}$ alkanol and $C_{4-12}$ cycloalkanol.

9. The method according to claim 7, wherein the cross-linking gas is the ether and selected from the group consisting of $C_{3-20}$ ether and $C_{5-12}$ cycloalkanol vinyl compounds.

10. The method according to claim 1, wherein the source gas is a compound having the formula $Si_\alpha O_{\alpha-1} R_{2\alpha-\beta+2} (OC_n H_{2n+1})_\beta$ wherein $\alpha$ is an integer of 1-3, $\beta$ is 2 or 3, n is an integer of 1-3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I.

11. The method according to claim 1, wherein the plasma reaction is conducted using radio-frequency power having an intensity of 1.5 W/cm$^2$ or higher.

12. The method according to claim 11, the radio-frequency power is a combination of high-frequency power and low-frequency power.

13. The method according to claim 1, wherein the flow rate of the inert gas is 15-300% of that of the source gas.

14. The method according to claim 1, wherein the flow rate of the cross-linking gas is 20-500% of that of the source gas.

15. The method according to claim 1, wherein the reaction gas is excited upstream of the reaction chamber.

16. A method for fabricating a semiconductor device, comprising:
   (a) selecting conditions for plasma reaction for depositing a silicon-containing insulation film using a dielectric constant and a diffusion coefficient of the film as criteria for selecting the conditions such that the silicon-containing insulation film has a target dielectric constant between about 2.9 and about 2.5 and a diffusion coefficient between about 250 $\mu^2$/min and about 50 $\mu^2$/min as measured using isopropyl alcohol, said plasma reaction using a reaction gas comprising (i) a source gas comprising a silicon containing hydrocarbon compound containing plural cross-linkable groups, (ii) a cross linking gas, (iii) an inert gas, and (iv) an oxygen-supplying gas, wherein a flow rate of the oxygen-supplying gas is greater than 0% and no more than 25% of that of the source gas, under conditions where if the flow of the oxygen-supplying gas increases, the dielectric constant of the forming film decreases, said selection of the conditions comprising:
      correlating the diffusion coefficient of the film with the flow rate of the oxygen supplying gas and selecting the flow rate of the oxygen-supplying gas using the diffusion coefficient as a criterion to adjust a diffusion coefficient of the film to the target diffusion coefficient based on the correlation between the diffusion coefficient of the film and the flow rate of the oxygen-supplying gas;
   (b) forming on a substrate a silicon-containing insulation film having the target diffusion coefficient between about 2.9 and about 2.5 and a diffusion coefficient between about 250 $\mu^2$/min and about 50 $\mu^2$/min as measured using isopropyl alcohol, using the selected conditions; and,
   (c) subjecting the insulation film to an integration process to fabricate a semiconductor device.

17. The method according to claim 16, wherein the reaction gas includes the oxygen-supplying gas and the conditions comprise controlling a flow of the source gas at 50-500 sccm; a flow of the cross-linking gas at 20-500% of that of the source gas; a flow rat of the inert gas at 15-300% of that of the source gas; the flow of the oxygen-supplying gas less than that of the cross-linking gas and that of the inert gas, respectively; an RF power at 1.5 W/cm$^2$ or higher; a pressure at 100-1,200 Pa; a temperature at 150-450° C.

18. The method according to claim 17, wherein the flow of the cross-linking gas is greater than that of the source gas and that of the inert gas, respectively.

19. The method according to claim 17, wherein the integration process is at least one selected from the group consisting of etching, ashing, CMP, resist formation, and rinsing.

20. The method according to claim 16, further comprising repeating steps (b) and (c).

* * * * *

UNITED STATES PATENT AND TRADEMARK OFFICE
CERTIFICATE OF CORRECTION

PATENT NO. : 7,718,544 B2
APPLICATION NO. : 11/382512
DATED : May 18, 2010
INVENTOR(S) : Naoto Tsuji et al.

It is certified that error appears in the above-identified patent and that said Letters Patent is hereby corrected as shown below:

At column 2, line 56, Change "$Si_\alpha O_{\alpha-1} R_{2\alpha-\beta+2}(OC_n H_{2n+2})_\beta$" to --$Si_\alpha O_{\alpha-1} R_{2\alpha-\beta+2}(OC_n H_{2n+1})_\beta$-- therefor.

At column 17, lines 8-9, in Claim 1, change "250 $\mu^2$/min" to --250 $\mu m^2$/min--.

At column 17, line 9, in Claim 1, change "50 $\mu^2$/min" to --50 $\mu m^2$/min-- therefor.

At column 17, line 28, in Claim 1, change "250 $\mu^2$/min" to --250 $\mu m^2$/min-- therefor.

At column 17, line 28, in Claim 1, change "50 $\mu^2$/min" to --50 $\mu m^2$/min-- therefor.

At column 18, line 18, in Claim 16, change "250 $\mu^2$/min" to --250 $\mu m^2$/min-- therefor.

At column 18, line 18, in Claim 16, change "50 $\mu^2$/min" to --50 $\mu m^2$/min-- therefor.

At column 18, line 39, in Claim 16, change "target diffusion coefficient" to --target dielectric constant-- therefor.

At column 18, line 41, in Claim 16, change "250 $\mu^2$/min" to --250 $\mu m^2$/min-- therefor.

At line 18, line 41, in Claim 16, change "50 $\mu^2$/min" to --50 $\mu m^2$/min-- therefor.

Signed and Sealed this

Nineteenth Day of October, 2010

David J. Kappos
*Director of the United States Patent and Trademark Office*